(12) United States Patent
Koyama (10) Patent No.: US 6,253,118 B1
(45) Date of Patent: Jun. 26, 2001

(54) SUBSTRATE TRANSPORT METHOD AND APPARATUS

(75) Inventor: Yasufumi Koyama, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 0 days.

(21) Appl. No.: 09/151,183

(22) Filed: Sep. 10, 1998

(30) Foreign Application Priority Data

Oct. 2, 1997 (JP) .................................................. 9-269523

(51) Int. Cl.⁷ ........................................................ G06F 7/00
(52) U.S. Cl. ........................ 700/218; 700/214; 414/937
(58) Field of Search .................................. 700/213, 214, 700/218, 228; 414/937, 217; 438/908

(56) References Cited

U.S. PATENT DOCUMENTS

| | | | | |
|---|---|---|---|---|
| 5,200,051 | * | 4/1993 | Cozzette et al. ...................... | 204/403 |
| 5,400,263 | * | 3/1995 | Rohrbaugh et al. ............ | 395/500.05 |
| 5,522,587 | * | 6/1996 | Banks et al. ....................... | 270/58.03 |
| 5,603,777 | * | 2/1997 | Ohashi ................................ | 134/25.4 |
| 5,734,574 | * | 3/1998 | Yamashita et al. ............. | 364/478.01 |
| 5,788,868 | * | 8/1998 | Itaba et al. .............................. | 216/41 |
| 5,841,515 | * | 11/1998 | Ohtani .................................... | 355/27 |
| 5,953,234 | * | 9/1999 | Singer et al. ...................... | 414/789.6 |
| 5,963,753 | * | 10/1999 | Ohtani et al. .......................... | 396/611 |
| 5,985,214 | * | 11/1999 | Stylli et al. .............................. | 422/65 |
| 5,988,857 | * | 11/1999 | Ozawa et al. ................... | 364/478.01 |
| 6,011,998 | * | 1/2000 | Lichti et al. ......................... | 700/230 |
| 6,038,490 | * | 3/2000 | Dimitri et al. ....................... | 700/214 |
| 6,066,210 | * | 5/2000 | Yonemitsu et al. .................. | 414/937 |
| 6,071,059 | * | 6/2000 | Mages et al. ........................ | 414/411 |
| 6,079,927 | * | 6/2000 | Muka .................................. | 414/217 |
| 6,082,950 | * | 7/2000 | Altwood et al. ..................... | 414/217 |

* cited by examiner

Primary Examiner—Christopher P. Ellis
Assistant Examiner—Khoi H. Tran
(74) Attorney, Agent, or Firm—Ostrolenk, Faber, Gerb & Soffen, LLP (57) ABSTRACT

A substrate transport method includes the steps of depositing a first substrate in a buffer section having a plurality of storages for temporarily storing substrates to transfer the substrates between a processing unit for performing various substrate treatments before and after an exposing process and an exposure unit for performing the exposing process, by actuating a first substrate transport device for transporting the substrates between the buffer section and the exposure unit and/or a second substrate transport device for transporting the substrates between the buffer section and the exposure unit; and depositing a second substrate on one of the storages next but at least one to a storage on which the first substrate is stored.

36 Claims, 7 Drawing Sheets

SUBSTRATE TRANSPORT METHOD AND APPARATUS

BACKGROUND OF THE INVENTION (1) Field of the Invention

The present invention relates to a substrate transport apparatus for use with a substrate processing system for performing varied treatments (e.g. film-forming, prebaking, exposure, development and postbaking) in a photolithographic process of substrates such as semiconductor wafers or glass substrates for liquid crystal displays. Specifically, the invention relates to a substrate transport method and apparatus for transferring substrates through a buffer section having a plurality of storages for temporarily storing the substrates, between a processing unit for performing varied treatments before and after an exposing process and an exposure unit for performing the exposing process.

(2) Description of the Related Art

A conventional substrate transport apparatus of the type noted above transfers substrates between the processing unit and exposure unit through a buffer section having a plurality (e.g. 50 stages) of storages for temporarily storing the substrates. This apparatus includes a first substrate transport device for transporting the substrates between the processing unit and buffer section, and a second substrate transport device for transporting the substrates between the buffer section and exposure unit.

This apparatus operates as follows, for example.

In the buffer section, the first to 25th storages counted from the bottom act as a feed buffer, and the 26th to 50th storages as a return buffer. The feed buffer stores unexposed substrates to be transported to the exposure unit. The return buffer stores exposed substrates transported from the exposure unit.

A first unexposed substrate having a film formed thereon and prebaked in the processing unit is received by the first transport device and deposited on the first (lowermost) storage of the feed buffer. Next, a second substrate is received by the first transport device and deposited on the lowermost one of the vacant storages (i.e. the second storage) of the feed buffer. In this way, each succeeding substrate treated in the processing unit is deposited on a next lower storage of the feed buffer.

The second transport device transfers the substrates, successively in the order of deposition, from the feed buffer to the exposure unit. Of the first and second substrates deposited as above, for example, the first substrate is first transferred to the exposure unit.

The first substrate exposed in the exposure unit is received by the second transport device, and deposited in the return buffer (e.g. the 26th and lowermost storage in the return buffer) of the buffer section. Next, the second substrate is deposited on the lowermost one of the vacant storages (e.g. the 27th storage immediately above the 26th storage). In this way, each succeeding substrate exposed in the exposure unit is deposited on a next lower storage of the return buffer.

The first transport device receives the substrate deposited first in the return buffer if there are substrates therein, and transfers it to the processing unit. The substrate transferred to the processing unit is developed therein.

The above substrate transporting mode absorbs a difference in throughput between the processing unit and exposure unit.

The conventional apparatus with the above construction has the following drawback.

When one of the first and second transport devices transports a substrate to or from the buffer section, the other substrate transport device cannot transport a substrate to or from not only the same storage but the two storages adjacent that storage. This is because the storages are arranged close to one another, and the two transport devices could interfere with each other in their vertical movements. Thus, the transport operation may be retarded. A waiting time is caused with the first or second transport device to lower throughput.

To avoid the above inconvenience, it is conceivable to arrange the storages at increased intervals. Then, naturally, only a reduced number of substrates could be stored, and the buffer section would have an increased height, requiring the transport devices to be movable to an increased height.

SUMMARY OF THE INVENTION

The present invention has been made having regard to the state of the art noted above, and its object is to provide a substrate transport method and apparatus employing a novel order for storing substrates to avoid a wasteful waiting time occurring in substrate transport, thereby to improve throughput.

The above object is fulfilled, in one aspect of the present invention, by a substrate transport method comprising the steps of:

depositing a first substrate in a buffer section having a plurality of storages for temporarily storing substrates to transfer the substrates between a processing unit for performing various substrate treatments before and after an exposing process and an exposure unit for performing the exposing process, by actuating a first substrate transport device for transporting the substrates between the buffer section and the processing unit and/or a second substrate transport device for transporting the substrates between the buffer section and the exposure unit; and depositing a second substrate on one of the storages next but at least one to a storage on which the first substrate is stored.

When storing substrates in the buffer section to transfer the substrates between the processing unit and exposure unit, each substrate is deposited on a storage spaced across at least one storage from a storage on which a preceding substrate is stored. While one of the first and second substrate transport devices is depositing a substrate on a storage, the other transport device can fetch a preceding substrate from a nearby storage. There is no possibility of interference between the two transport devices since the preceding substrate is stored adjacent but at least two storages away from the storage receiving the new substrate. Thus, even when a substrate is being deposited, a different substrate may be fetched from a nearby position. Such substrate transport does not involve a wasteful waiting time.

Thus, the substrates may be transported efficiently between the processing unit and exposure unit to achieve improved throughput.

In another aspect of the invention, a substrate transport apparatus is provided, which comprises:

a processing unit for performing various substrate treatments before and after an exposing process;

an exposure unit for performing the exposing process;

a buffer section having a plurality of storages for temporarily storing substrates to exchange the substrates with the exposure unit;

a first substrate transport device for exchanging the substrates with the processing unit and depositing and fetching the substrates on/from the storages;

a second substrate transport device for exchanging the substrates with the exposure unit and depositing and fetching the substrates on/from the storages; and a control device for controlling the first substrate transport device and the second substrate transport device to deposit each of the substrates on one of the storages next but at least one to a storage on which a preceding substrate is stored.

The control device controls the first and second substrate transport devices such that, when storing substrates in the buffer section, each substrate is deposited on a storage spaced across at least one storage from a storage on which a preceding substrate is stored. While one of the first and second transport devices is depositing a substrate on a storage, the other transport device can fetch a preceding substrate from a nearby storage. There is no possibility of interference between the two transport devices since the preceding substrate is stored adjacent but at least two storages away from the storage receiving the new substrate. Thus, even when a substrate is being deposited, a different substrate may be fetched from a nearby position. Such substrate transport does not involve a wasteful waiting time.

Thus, the substrates may be transported efficiently between the processing unit and exposure unit to achieve improved throughput. Even when the precision for adjusting heights of the first and second substrate transport devices has lowered over time, there occurs no possibility of damaging the substrates since no substrates are stored on the storages adjacent a storage being aimed at.

The plurality of storages may be divided into two groups consisting of a feed buffer and a return buffer, the control device using the feed buffer for storing the substrates transported from the processing unit, and the return buffer for storing the substrates transported from the exposure unit.

In this case, the buffer section is divided into the feed buffer and return buffer each for storing substrates in a different condition. This facilitates control of movements of the first and second transport devices. Even when the processing system breaks down to discontinue the processing, numerous substrates stored in the buffer section may readily be discriminated according to conditions, i.e. between unexposed and exposed, which are indistinguishable to the eye.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

A preferred embodiment of the present invention will be described in detail hereinafter with reference to the drawings.

Figure 1:
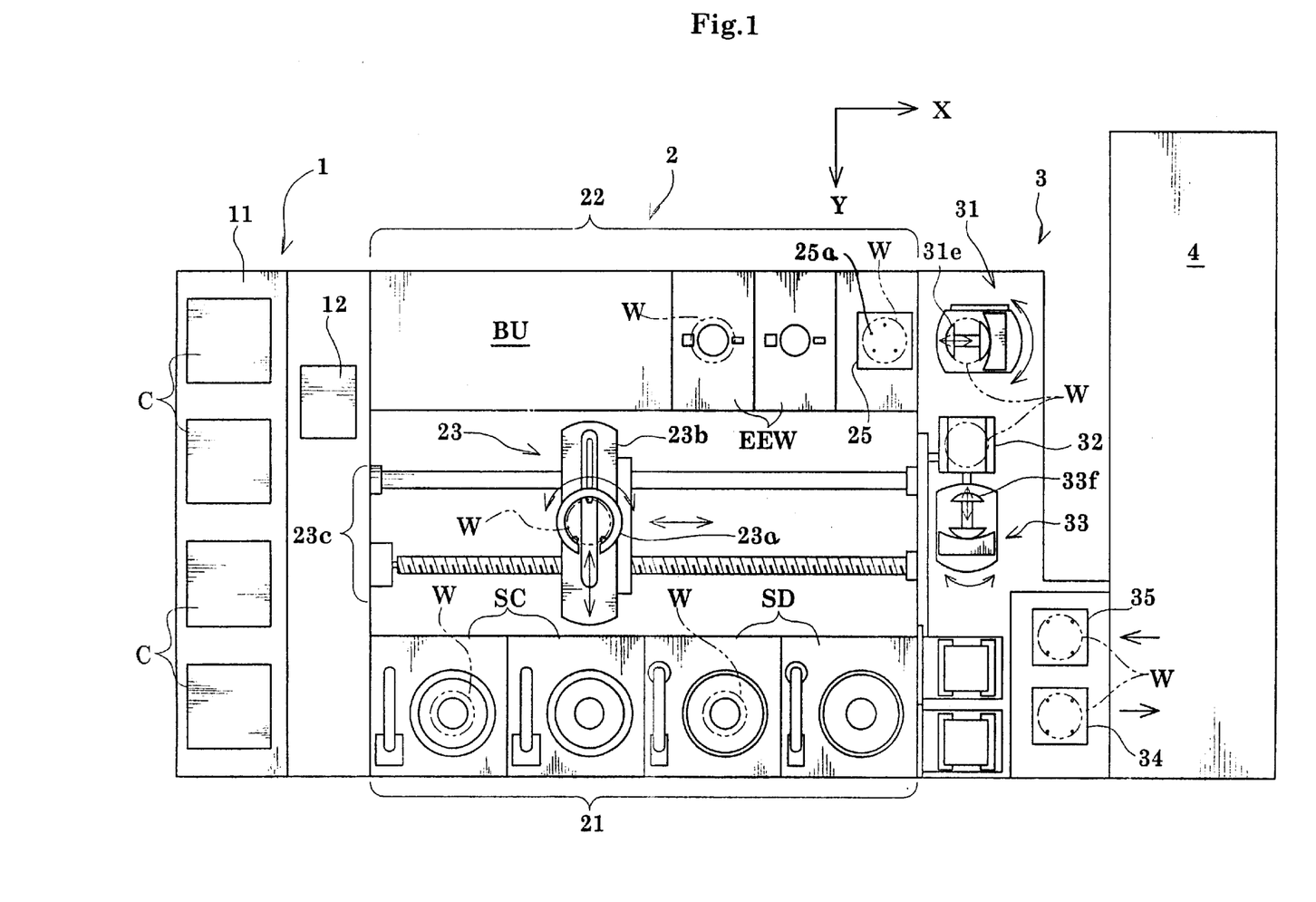
FIG. 1 is a plan view showing an outline of a substrate processing system having a substrate transport apparatus according to the present invention.
Figure 2:
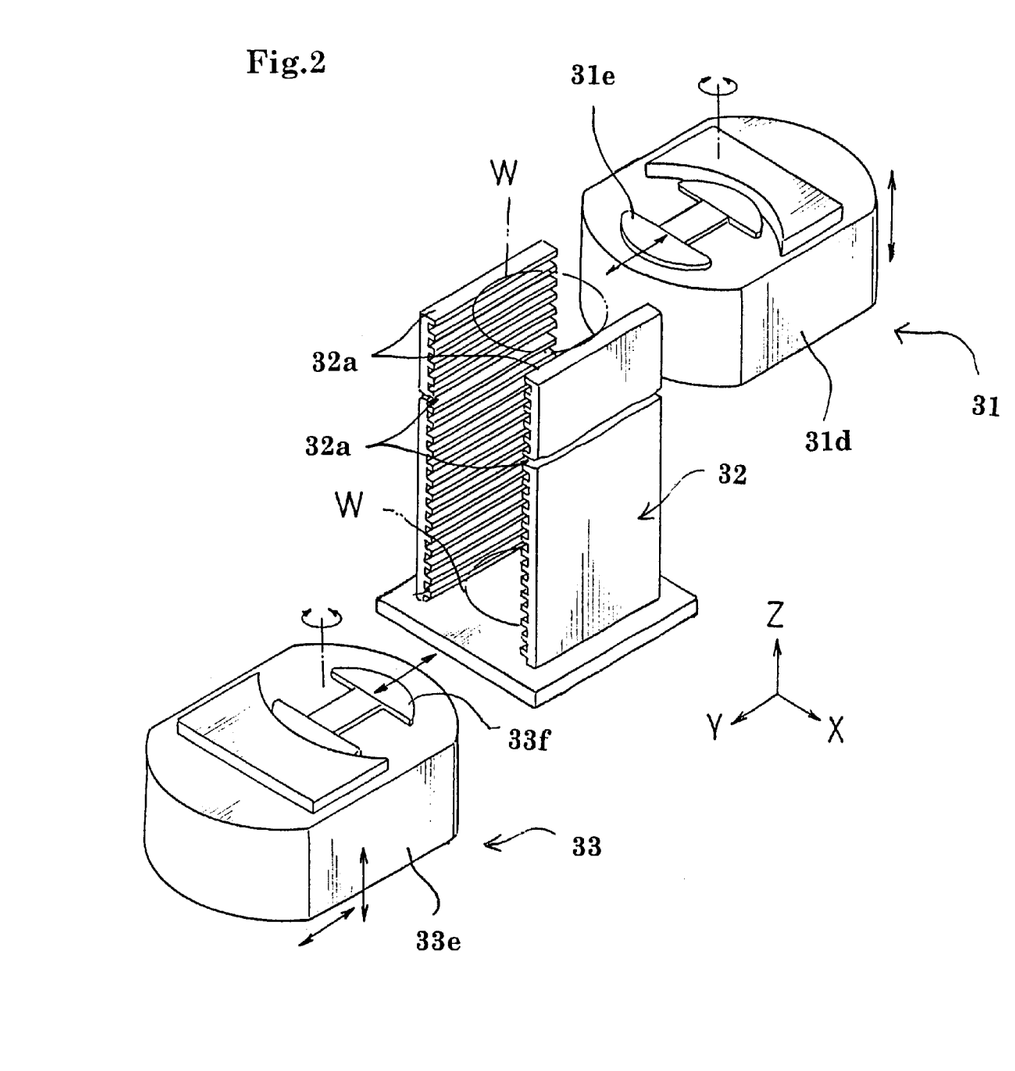
FIG. 2 is a perspective view showing an outline of the substrate transport apparatus.
Figure 3:
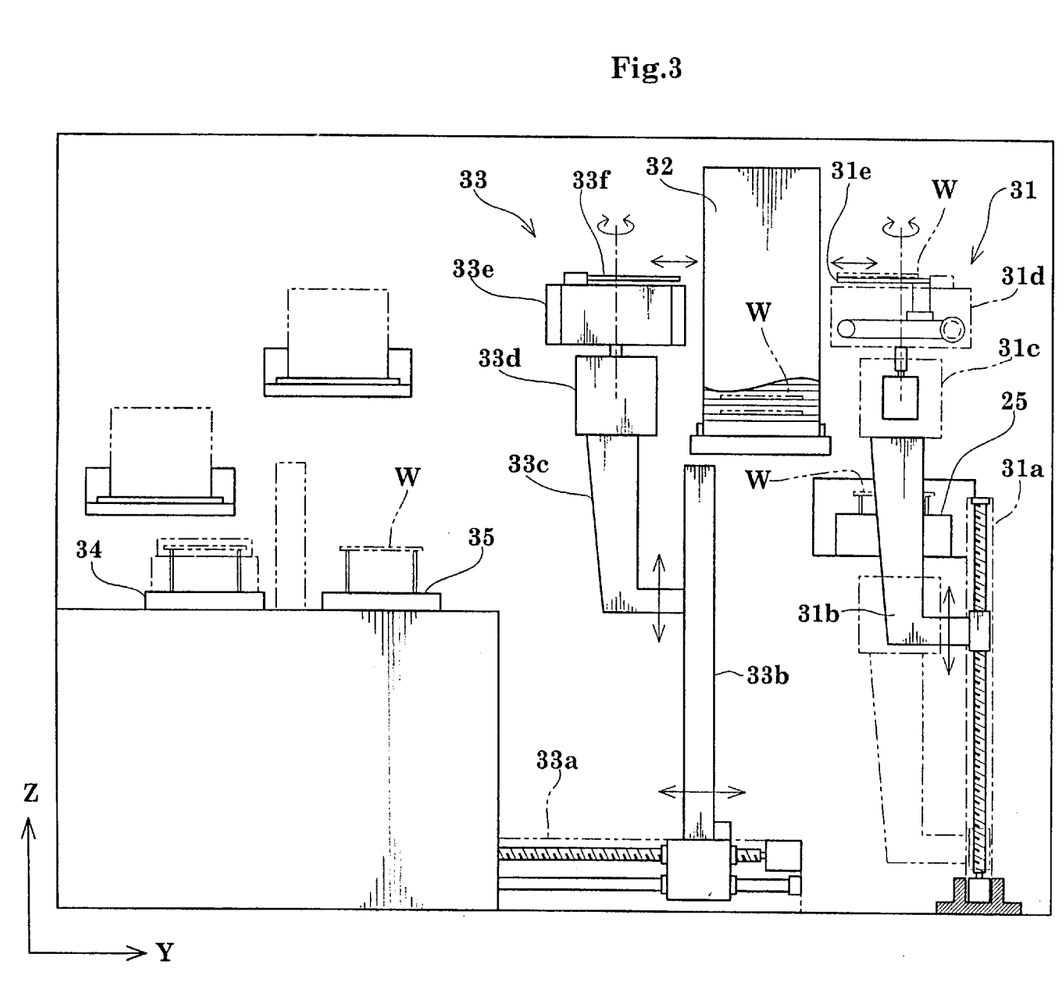
FIG. 3 is a view of the substrate processing system seen from an exposure unit.

FIG. 1 is a plan view showing an outline of a substrate processing system having a substrate transport apparatus according to the invention. FIG. 2 is a perspective view showing an outline of the substrate transport apparatus. FIG. 3 is a view of the substrate processing system seen from an exposure unit.

The substrate processing system includes an indexer 1, a processing unit 2, an interface unit 3 and an exposure unit 4.

The indexer 1 includes a table 11 for receiving carriers C each storing a plurality of wafers W, and a substrate intake/output robot 12 for exchanging the wafers W with a substrate transport robot 23 (described hereinafter) in the processing unit 2.

The processing unit 2 includes a first apparatus area 21, a second apparatus area 22, and the substrate transport robot 23. The first apparatus area 21 accommodates a plurality of spin coaters SC for coating the wafers W with a photoresist film, and a plurality of spin developers SD for performing development, which are arranged along the x-axis in FIG. 1. The second apparatus area 22 accommodates a bake unit BU for prebaking and postbaking wafers W, and a plurality of edge exposure units EEW.

The bake unit BU includes a plurality of heaters for heating wafers W to a predetermined temperature, and a plurality of coolers for cooling the heated wafers W substantially to room temperature. The heaters and coolers are arranged two-dimensionally along the x-axis and in the vertical direction (along the z-axis perpendicular to the plane of FIG. 1). The second apparatus area 22 further accommodates a substrate transfer table 25 disposed adjacent the interface unit 3 for exchanging wafers W with a first substrate transport robot 31 in the interface unit 3 as described hereinafter. The substrate transfer table 25 has a plurality of substrate support pins 25a erected thereon for supporting a wafer W to be exchanged.

The substrate transport robot 23 is provided between the first and second apparatus areas 21 and 22. The substrate transport robot 23 includes a C-shaped hand 23a for supporting a wafer W. The hand 23a is mounted on a movable deck 23b to be movable horizontally in the x-direction by an x-direction mover 23c including a guide rod and a screw shaft extending along the first and second apparatus areas 21 and 22, and vertically in the z-direction by a z-direction mover not shown. The hand 23a is movable in a horizontal plane (XY plane) and rotatable about the z-axis on the movable deck 23b.

With appropriate combinations of rotation, horizontal and vertical movements in the x- and z-directions, and extension and retraction of the hand 23b, the substrate transport robot 23 transports wafers W to and from the processing devices such as the spin coaters SC, spin developers SD, baking unit BU and edge exposure units EEW, and to and from the substrate transfer table 25.

The interface unit 3 corresponds to the substrate transport apparatus of the present invention, and includes the first substrate transport robot 31, a buffer section 32, a second substrate transport robot 33, a substrate input table 34 and a substrate output table 35. These components are integrated into a unit.

The first substrate transport robot 31 includes a z-direction driver 31a, a connector 31b, a rotary driver 31c, an extender 31d and a substrate support 31e. The z-direction driver 31a has a screw shaft erected to extend in the z-direction, and a motor for driving the connector 31b in the z-direction to raise and lower the rotary driver 31c. The rotary driver 31c houses a motor with a rotary shaft extending vertically for rotating the extender 31d in the XY plane about the z-axis. The extender 31d has a motor rotatable to advance and retract the substrate support 31e in the XY plane, the substrate support 31e being operatively connected to a wire wound around a drive pulley and a driven pulley. The first substrate transport robot 31 corresponds to the first substrate transport device of the present invention.

Figure 4:
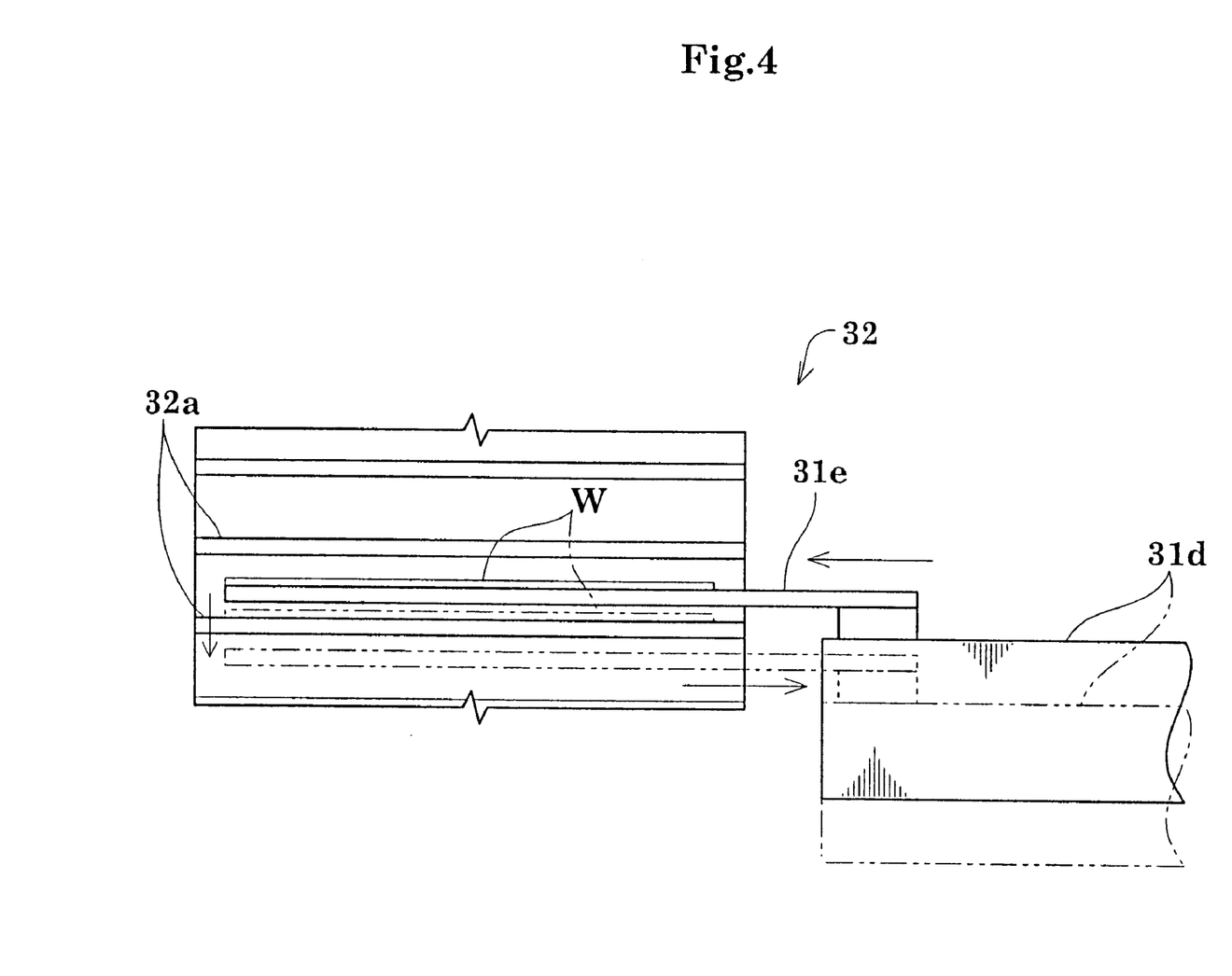
FIG. 4 is an explanatory view illustrating a sequence in which the substrate transport apparatus deposits substrates in a buffer section.

The first transport robot 31 transfers wafers W between the substrate transfer table 25 and predetermined storages 32a of the buffer section 32. FIG. 4 shows how wafers W are deposited on the storages 32a in the buffer section 32.

First, the rotary driver 31c rotates the substrate support 31e to a direction facing the buffer section 32. The z-direction driver 31a adjusts the height of the substrate support 31e to the level of the storage 32a on which the wafer W is to be deposited. Next, the substrate support 31e is extended to place the wafer W supported thereon above the storage 32a. Then, the z-direction driver 31a lowers the substrate support 31e in the z-direction to deposit the wafer W on the storage 32a. The substrate support 31e is lowered below the storage 32a holding the wafer W, and is retracted from a storage 32a below to complete the wafer depositing operation. When fetching a wafer W from the buffer section 32, the operation is reversed for raising the substrate support 31e to pick up the wafer W from below.

The buffer section 32 is fixedly supported on a side wall of the interface unit 3, and includes a plurality of storage racks 32a arranged in a plurality of stages racks. Each storage 32a is open toward the first substrate transport robot 31 and second substrate transport robot 33 to be accessible to the transport robots 31 and 33 in substrate depositing and fetching (remove) operations.

The second substrate transport robot 33 includes a y-direction driver 33a having a guide rod and a screw shaft extending horizontally, a z-direction driver 33b mounted on the y-direction driver 33a to be movable in the y-direction, a connector 33c, a rotary driver 33d, an extender 33e and a substrate support 33f. The y-direction driver 33a is fixed to an inner side wall of the interface unit 3 for moving the entire robot 33 in the y-direction. The connector 33c, rotary driver 33d and extender 33e have the same constructions as their counterparts in the first substrate transport robot 31. The second substrate transport robot 33 corresponds to the second substrate transport device of the present invention.

The second transport robot 33 transfers wafers W between the storage racks 32a of the buffer section 32 and the substrate input table 34 and substrate output table 35. The wafer transport to and from the buffer section 32 is carried out in the same way as in the case of the first transport robot 31. A wafer W is loaded on the substrate input table 34 or unloaded from the substrate output table 35 by using support pins arranged on each table 34 or 35. The wafer W supported by these support pins is transported to or from the exposure unit 4.

The exposure unit 4 includes an exposing machine (not shown) such as a reduction projecting/exposing machine (or stepper), an alignment mechanism (not shown) for positioning wafers W, and a substrate transport robot (not shown) for transporting the wafers W within the exposure unit 4. All these devices are integrated into a unit. The substrate transport robot in the exposure unit 4 also takes into the exposure unit 4 unexposed wafers W placed on the substrate input table 34 in the interface unit 3, and outputs exposed wafers W from the exposure unit 4 onto the substrate output table 35 in the interface unit 3.

Figure 5:
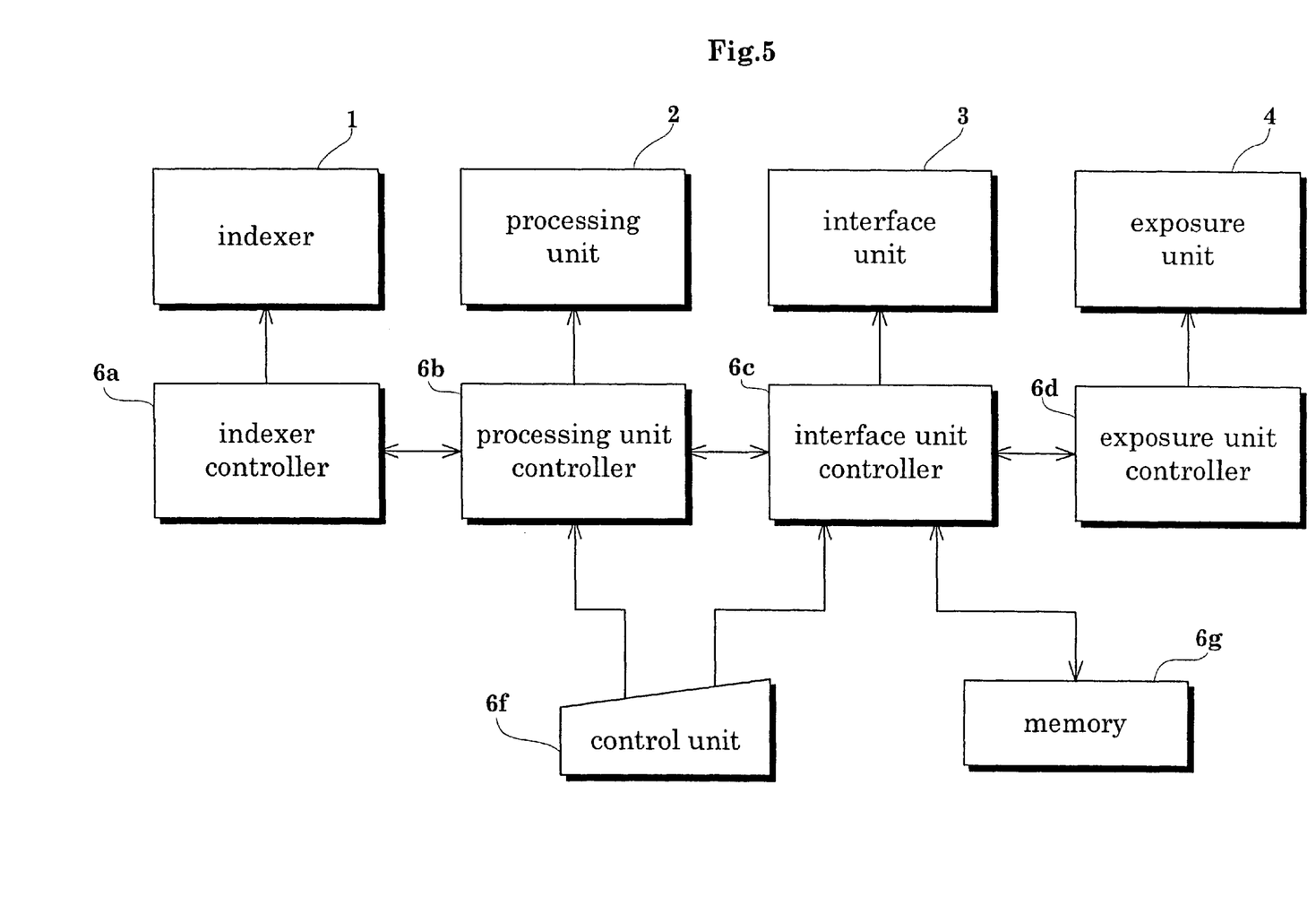
FIG. 5 is a block diagram of a control system.

A control system of the above substrate processing system is constructed as shown in FIG. 5.

The control system includes an indexer controller 6a, a processing unit controller 6b, an interface unit controller 6c and an exposure unit controller 6d.

The indexer controller 6a controls the substrate intake/output robot 12 and the like in the indexer 1 to fetch (remove) wafers W to be processed from the carriers C and transfer these wafers W to the substrate transport robot 23 in the processing unit 2, and to receive processed wafers W and store these wafers W in the carriers C.

The processing unit controller 6b controls the various devices in the processing unit 2 (i.e. the spin coaters SC, spin developers SD and so on) to perform the series of treatments in the processing unit 2 according to a sequence set by a control unit 6f, and to transport wafers W to/from the substrate transfer table 25.

The interface unit controller 6c, which corresponds to the control device of the present invention, controls the first and second substrate transport robots 31 and 33 in the interface unit 3 to transport unexposed wafers W from the processing unit 2 to the exposure unit 4, and exposed wafers W from the exposure unit 4 to the processing unit 2. The interface unit controller 6c has connected thereto a memory 6g storing information concerning how the storage racks 32a in the buffer section 32 should be used and "stage information" which storage racks 32a should be used (e.g. every other storage being used in this embodiment).

Figure 6:
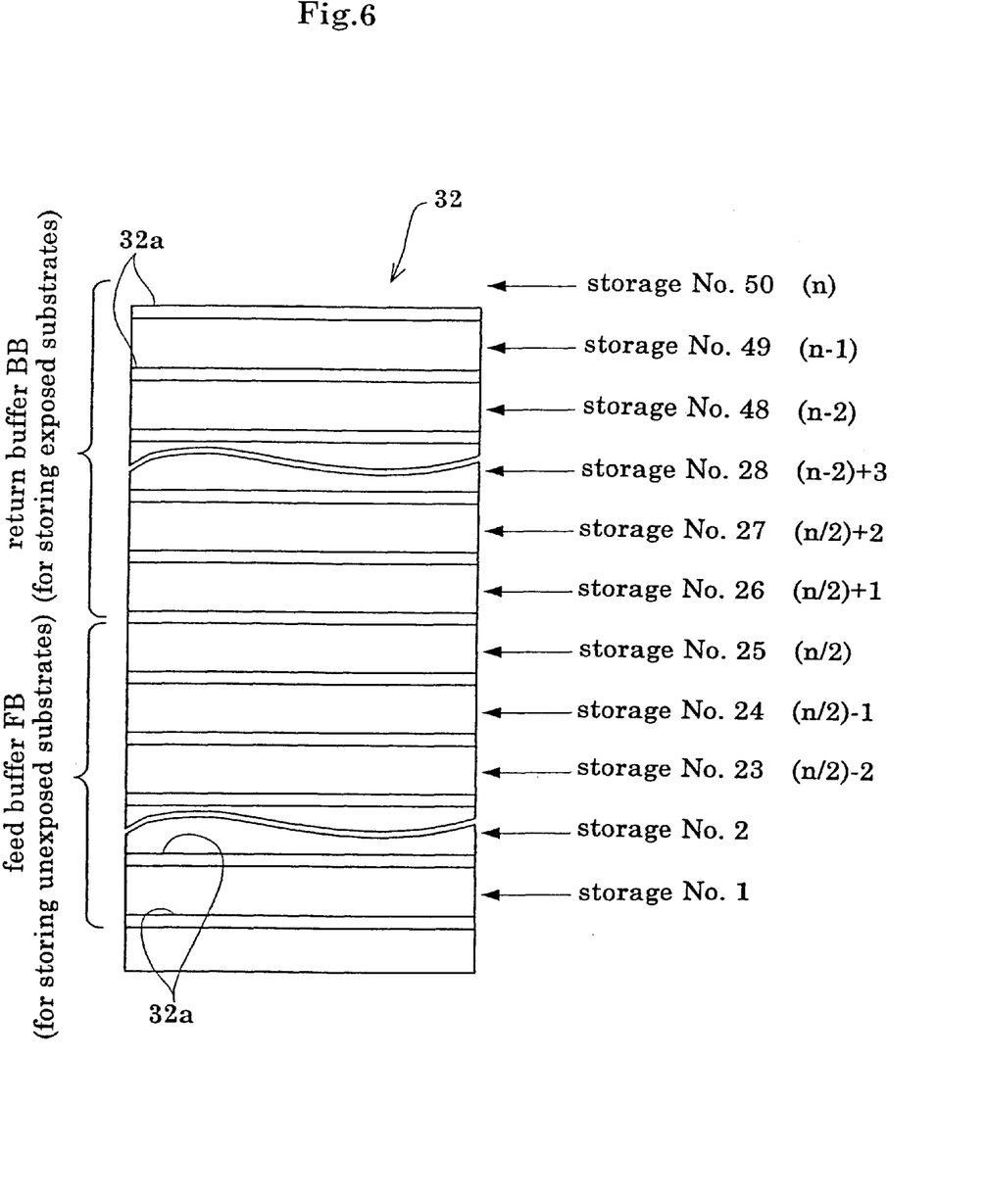
FIG. 6 is an explanatory view showing a storage allocation of the buffer section.

In this embodiment, as shown in FIG. 6, the storage racks 32a in the buffer section 32 are numbered 1 to 50, and are vertically divided into two groups, for example. The 25 storage racks 32a, Nos. 1 through 25, are used as a feed buffer FB, while the remaining 25 storage racks 32a, Nos. 26 through 50, are used as a return buffer BB. This "group information" also is stored in the memory 6g. The feed buffer FB is used for storing unexposed wafers W transported from the transfer table 25 to the exposure unit 4. The return buffer BB is used for storing exposed wafers W transported from the exposure unit 4 to the transfer table 25.

The "group information" may be set such that, instead of dividing the plurality of storage racks 32a as described above, the storage racks 32a are used alternately for feeding and returning the wafers W, wherein, for example, No. 1 storage 32a is used as part of the feed buffer FB, and No. 3 storage 32a as part of the return buffer BB.

The exposure unit controller 6d controls the various devices in the exposure unit 4. Under control of this controller 6d, a series of exposing steps is performed by taking each unexposed wafer W from the substrate input table 34 into the exposure unit 4, positioning and exposing the wafer W, and discharging the exposed wafer W onto the substrate output table 35.

The indexer controller 6a, processing unit controller 6b, interface unit controller 6c and exposure unit controller 6d are in communication with one another to exchange information regarding timing of depositing and fetching the wafers W.

Next, operations of the substrate processing system having the above construction will be described. An operation of the interface unit 3 in particular will be described in detail.

When a carrier C storing wafers W (which are stacked one upon another) to be processed is placed on the table 11, the substrate intake/output robot 12 of the indexer 1 withdraws the unprocessed wafers W, one at a time, from the carrier C and successively passes the wafers W to the substrate transport robot 23 in the processing unit 2. In the processing unit 2, the wafers W receive the pre-exposure treatments such as film formation and prebaking. After the pre-exposure treatments are completed, the wafers W (to be exposed) are placed on the substrate transfer table 25.

Figure 7:
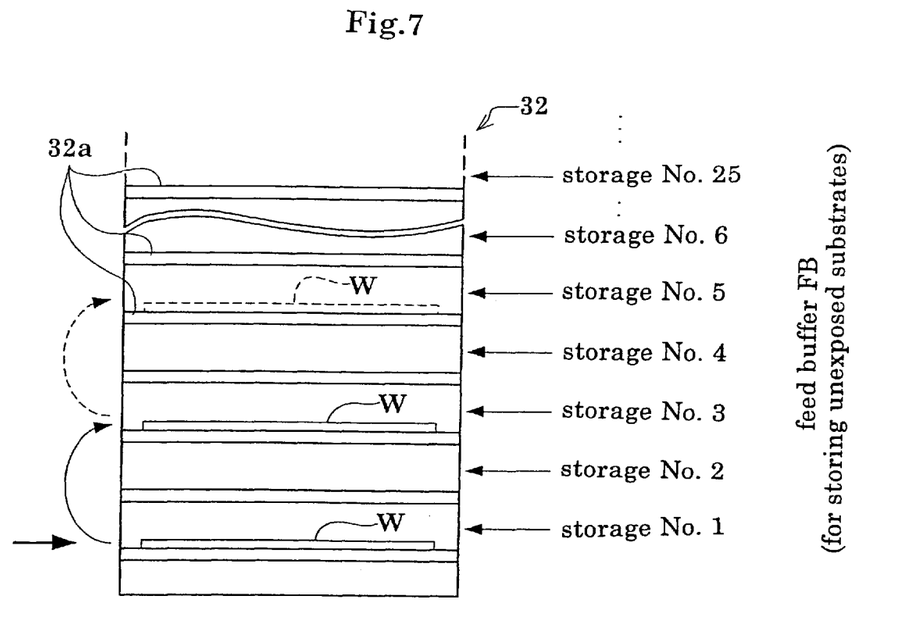
FIG. 7 is an explanatory view showing an order of depositing substrates in a feed buffer.

Then, the interface unit 3 successively feeds the wafers W to be exposed from the transfer table 25 to the exposure unit 4. Specifically, the first substrate transport robot 31 picks up the first wafer W to be exposed from the transfer table 25, and deposits it in the feed buffer FB of the buffer section 32. The order of storage is set in this embodiment such that, as shown in FIG. 7, the storage racks 32a are used in the order starting with No. 1 storage 32a located at the bottom of the feed buffer FB. Thus, the first wafer W to be exposed is deposited on No. 1 storage 32a in the feed buffer.

As the second and subsequent wafers W to be exposed are placed on the transfer table 25, the first transport robot 31 successively deposits these wafers W in the feed buffer FB. This depositing operation is based on the "stage information" stored in the memory 6g. In this embodiment, the "stage information" is set to use of alternate stages, and therefore, as shown in FIG. 7, the second and subsequent wafers W to be exposed are deposited in No. 3 and upper storage racks 32a, skipping the even-numbered storage racks 32a. That is, the wafers are stored in alternate storage racks 32a with one empty intervening storage rack 32a being located between each used storage rack 32a.

When the exposure unit 4 is ready to perform an exposing process, the second transport robot 33 fetches the wafer W to be exposed which was deposited earliest in the feed buffer FB of the buffer section 32. Assume, for example, that the first wafer W to be exposed has been deposited in the feed buffer FB and the second wafer W to be exposed is being deposited in the feed buffer FB as noted above. In this case, the second transport robot 33 advances the substrate support 33e (FIG. 2) to fetch the first wafer W from No. 1 storage 32a. Where wafers W are stored in successive stages as in the prior art, and the first transport robot 31 is depositing the second wafer W at the same time that the second transport robot 33 is removing the first wafer W, the first transport robot 31 and second transport robot 33 will interfere with each. Thus, the second transport robot 33 cannot remove the first wafer W to be exposed. According to the present invention, the first wafer W to be exposed may be removed with no such inconvenience since the wafers W are stored on alternate storage racks 32a.

Figure 8:
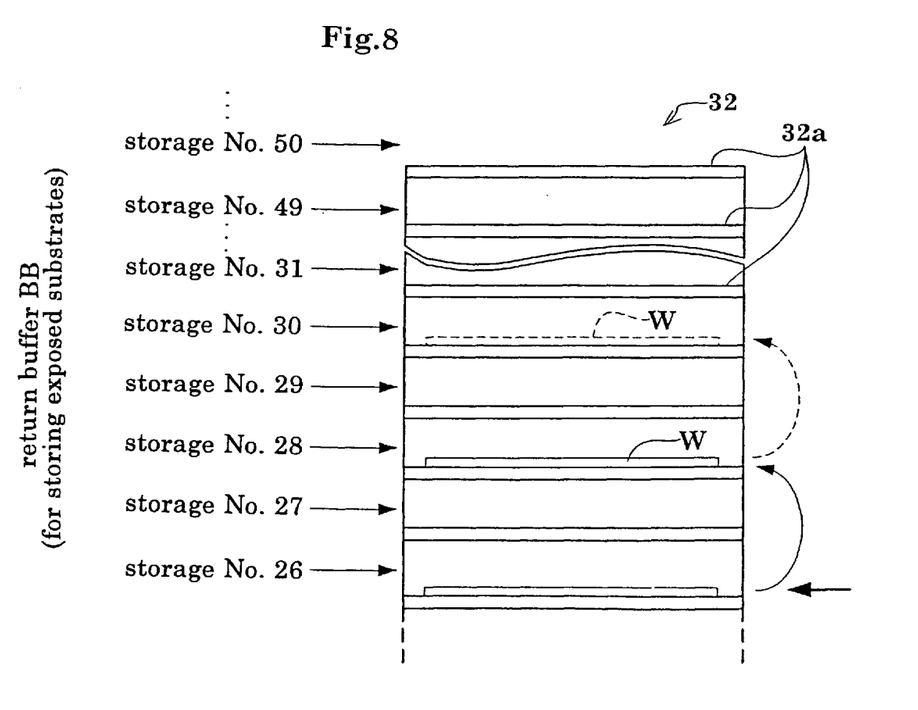
FIG. 8 is an explanatory view showing an order of depositing substrates in a return buffer.

When the exposure unit 4 completes an exposing process for the first wafer W, the exposed wafer W is placed on the substrate output table 35. Then, as shown in FIG. 8, the second transport robot 33 deposits the first exposed wafer W on No. 26 storage racks 32a in the return buffer BB. The second and subsequent exposed wafers W are deposited on alternate (i.e., every other) storage rack 32a. For example, the second exposed water W will be deposited on the No. 28 storage rack 32a which is located above the No. 26 storage rack with an empty storage rack 32a (No. 27) located therebetween. The first transport robot 31 fetches the exposed wafer W which was deposited earliest in the return buffer BB, and transports the wafer W for developing and postbaking processes. When, for example, the first exposed wafer W has already been deposited in the return buffer BB and the second exposed wafer W is in the process of being deposited in the return buffer BB, the first transport robot 31 fetches the first exposed wafer W. That is, the first transport robot 31 is removing the first exposed wafer W at the same time that the second transport robot 33 is depositing the second exposed wafer W. According to the present invention, the first exposed wafer W and second exposed wafer W are stored on storage racks 32a which are spaced apart from one another with an empty storage rack 32 a (No. 27 located therebetween. This storage arrangement effectively avoids the inconvenience of the first transport robot 31 and second transport robot 33 interfering with each other.

As described above, while one of the first and second substrate transport robots 31 or 33 is depositing a wafer W in the buffer section 32, the other can fetch a wafer W from a nearby position. Such substrate transport is free from retardation, with no waiting time required. Thus, the substrate processing system has improved throughput.

As described hereinbefore, the buffer section 32 is divided into the two groups consisting of the feed buffer FB and return buffer BB. This facilitates movement control of the first and second substrate transport robots 31 and 33. When, for example, the processing system comes to a stop due to some trouble, the above storage arrangement facilitates a discrimination between unexposed wafers W and exposed wafers W which are indistinguishable to the eye. Thus, the inconvenience of mixing these wafers may be avoided, and the processing may be continued with a different system in normally operative condition.

Further, the wafers W are not stored in a continual way in the buffer section 32 according to the invention. For example, the precision for adjusting heights of the first and second substrate transport robots 31 and 33 may lower over time, whereby the transport robot 31 or 33 could access a wrong storage rack 32a. The storage arrangement according to the invention precludes the possibility of damaging wafers W on such an occasion.

In the foregoing embodiment, the wafers W are stored in alternate storage racks 32a. A similar advantage may be realized as long as at least one storage rack 32a is skipped in using one storage 32a after another. Thus, two or more storage racks 32a may be skipped in use.

The present invention may be embodied in other specific forms without departing from the spirit or essential attributes thereof and, accordingly, reference should be made to the appended claims, rather than to the foregoing specification, as indicating the scope of the invention.

What is claimed is:

1. A process for transporting substrates between a processing unit, a buffer section and an exposure unit, said exposure unit performing an exposing process on said substrates, said processing unit performing various substrate treatments before and after said exposing process, said buffer section having a plurality of storage racks, said method comprising:

sequentially transferring a plurality of unexposed substrates from said processing unit to said buffer section, each substrate of each consecutive pair of substrates transferred from said processing unit to said buffer section being placed on respective storage racks which are separated from one another by at least one empty intervening storage rack; and sequentially transferring a plurality of exposed substrates from said exposure unit to said buffer section, each substrate of each consecutive pair of substrates transferred from said exposure unit to said buffer section being placed on respective storage racks which are separated from one another by at least one empty intervening storage rack.

2. A process according to claim 1, wherein said at least one empty intervening storage rack is a single storage rack.

3. A process according to claim 1, wherein two of said consecutive unexposed substrates are first and second unexposed substrates which are placed on first and second non-adjacent storage racks, said process further including removing said first unexposed substrate from said first storage rack while said second unexposed substrate is being deposited on said second storage rack.

4. A process according to claim 3, wherein said first and second unexposed substrates are placed on said first and second storage racks by a first robot and said first unexposed substrate is removed from said first storage rack by a second robot.

5. A process according to claim 4, wherein said first robot transfers said unexposed substrates from said processing unit to said buffer section and said second robot transfers said unexposed substrates from said buffer section to said exposure unit.

6. A process according to claim 5, wherein the locations of said first, second and said at least one empty intervening storage rack are such that if said first robot attempted to place said second unexposed substrate on one of said empty intervening storage racks while said second robot attempted to remove said first unexposed substrate from said first storage rack, said first and second robots would interfere with one another.

7. A process according to claim 1, further including sequentially transferring a plurality of exposed substrates from said exposure unit to said buffer section, each consecutive pair of exposed substrates transferred from said exposure unit to said buffer section being placed on respective storage racks which are separated from one another by at least one empty intervening storage rack.

8. A process according to claim 7, wherein said buffer section is divided into a first section for holding said unexposed substrates unit and a second section for holding said exposed substrates.

9. A process according to claim 7, wherein said at least one empty intervening storage racks are a single storage rack.

10. A process according to claim 7, wherein two consecutive exposed substrates are first and second are exposed substrates transferred from said exposure unit to first and second storage racks, said process further including removing said first exposed substrate from said first storage rack of said buffer section for transfer to said processing unit while said second exposed substrate is being deposited on said second storage rack.

11. A process according to claim 1, wherein said buffer section has first and second side walls, a plurality of rack elements extending from said first side wall part way towards said second side wall, a plurality of rack elements extending from said second side wall partway towards said first side wall, a respective rack element on each side wall cooperating with a respective rack elements on the other side wall to define a respective storage rack.

12. A process according to claim 11, wherein each said rack element is a straight shelf extending perpendicular to that said wall from which it extends.

13. A process according to claim 1, wherein said storage racks are located one above the other.

14. A process according to claim 7, wherein a first robot transfers said substrates between said processing unit and said buffer section and a second robot transfers said substrates between said exposure section and said buffer unit.

15. A process for transporting substrates between a processing unit, a buffer section and an exposure unit, said exposure unit performing an exposing process on said substrates, said processing unit performing various substrate treatments before and after said exposing process, said buffer section having a plurality of storage racks, said method comprising:

sequentially transferring a plurality of exposed substrates from said exposure unit to said buffer section, each substrate of each consecutive pair of exposed substrates transferred from said exposure unit to said buffer section being placed on respective storage racks which are separated from one another by at least one empty intervening storage rack.

16. A process according to claim 15, wherein said at least one empty intervening storage rack is a single storage rack.

17. A process according to claim 15, wherein two of said consecutive exposed substrates are first and second exposed substrates which are placed on first and second non-adjacent storage racks, said process further including removing said first exposed substrate from said first storage rack while said second exposed substrate is being deposited on said second storage rack.

18. A process according to claim 17, wherein said first and second exposed substrates are placed on said first and second storage racks by a first robot and said first exposed substrate is removed from said first storage rack by a second robot.

19. A process according to claim 18, wherein said first robot transfers said exposed substrates from said processing unit to said buffer section and said second robot transfers said exposed substrates from said buffer section to said exposure unit.

20. A process according to claim 19, wherein the locations of said first, second and said at least one empty intervening storage rack are such that if said first robot attempted to place said second exposed substrate on one of said empty intervening storage racks while said second robot attempted to remove said first exposed substrate from said first storage rack, said first and second robots would interfere with one another.

21. Apparatus comprising:

a processing unit for performing various treatments on said substrates;

an exposure unit for exposing substrates;

a buffer section having a plurality of storage racks;

a first robot for consecutively transferring a plurality of unexposed substrates from said processing unit to said buffer section, each substrate of each consecutive pair of substrates transferred from said processing unit to said buffer section being placed on respective storage racks which are separated from one another by at least one empty intervening storage rack; and a second robot for consecutively transferring a plurality of exposed substrates from said exposure unit to said buffer section, each substrate of each consecutive pair of substrates transferred from said exposure unit to said buffer section being placed on respective storage racks which are separated from one another by at least one empty intervening storage rack.

22. Apparatus according to claim 21, wherein said at least one empty intervening storage rack is a single storage rack.

23. Apparatus according to claim 21, wherein two of said consecutive unexposed substrates are first and second non-adjacent unexposed substrates which are placed on first and second storage racks, and further including a second robot for removing said first unexposed substrate from said first storage rack while said second unexposed substrate is being deposited on said second storage rack by said first robot.

24. Apparatus according to claim 23, wherein said first robot transfers said unexposed substrates from said processing unit to said buffer section and said second robot transfers said unexposed substrates from said buffer section to said exposure unit.

25. Apparatus according to claim 24, wherein the locations of said first, second and said at least one empty intervening storage rack are such that if said first robot attempted to place said second unexposed substrate on one of said empty intervening storage racks while said second robot attempted to remove said first unexposed substrate from said first storage rack, said first and second robots would interfere with one another.

26. Apparatus according to claim 24, wherein said second robot sequentially transfers a plurality of exposed substrates from said exposure unit to said buffer section, each consecutive pair of exposed substrates transferred from said exposure unit to said buffer section being placed on respective storage racks which are separated from one another by at least one empty intervening storage rack.

27. Apparatus according to claim 26, wherein said buffer section is divided into a first section for holding said unexposed substrates unit and a second section for holding said exposed substrates.

28. Apparatus according to claim 26, wherein said at least one empty intervening storage racks are a single storage rack.

29. Apparatus according to claim 25, wherein two consecutive exposed substrates are first and second exposed substrates transferred from said exposure unit to first and second storage racks and said first robot removes said first exposed substrate from said first storage rack of said buffer section for transfer to said processing unit while said second robot deposits said second exposed substrate on said second storage rack.

30. Apparatus according to claim 21, wherein said buffer section has first and second side walls, a plurality of rack elements extending from said first side wall part way towards said second side wall, a plurality of rack elements extending from said second side wall partway towards said first side wall, a respective rack element on each side wall cooperating with a respective rack elements on the other side wall to define a respective storage rack.

31. Apparatus according to claim 30, wherein each said rack element is a straight shelf extending perpendicular to that said wall from which it extends.

32. Apparatus according to claim 21, wherein said storage racks are located one above the other.

33. Apparatus comprising:
a processing unit for performing various treatments on said substrates;
an exposure unit for exposing substrates;
a buffer section having a plurality of storage racks;
a first robot for sequentially transferring a plurality of exposed substrates from said exposure unit to said buffer section, each substrate of each consecutive pair of exposed substrates transferred from said exposure unit to said buffer section being placed on respective storage racks which are separated from one another by at least one empty intervening storage rack.

34. Apparatus according to claim 33, wherein said at least one empty intervening storage rack is a single storage rack.

35. Apparatus according to claim 33, wherein two of said consecutive exposed substrates are first and second exposed substrates which are placed on first and second non-adjacent storage racks, and further including a second robot for removing said first exposed substrate from said first storage rack while said second exposed substrate is being deposited on said second storage rack by said first robot.

36. Apparatus according to claim 35, wherein the locations of said first, second and said at least one empty intervening storage rack are such that if said first robot attempted to place said second exposed substrate on one of said empty intervening storage racks while said second robot attempted to remove said first exposed substrate from said first storage rack, said first and second robots would interfere with one another.

* * * * *